United States Patent [19]

Goodale

[11] 4,381,498
[45] Apr. 26, 1983

[54] ANALOG-TO-DIGITAL CONVERTING APPARATUS

[75] Inventor: Thomas C. Goodale, Reading, Mass.

[73] Assignee: GTE Laboratories Incorporated, Waltham, Mass.

[21] Appl. No.: 280,642

[22] Filed: Jul. 6, 1981

[51] Int. Cl.³ .................. H03K 13/02; H03K 13/20
[52] U.S. Cl. ......................... 340/347 AD; 324/99 D
[58] Field of Search ................ 340/347 M, 347 AD; 324/99 D

[56] References Cited

U.S. PATENT DOCUMENTS 3,448,446 6/1969 James et al. ................ 340/347 CC

OTHER PUBLICATIONS

Schmid, Electronic Analog/Digital Conversions, Van Nostrand Reinhold Co., 1970, pp. 274–281, 396–399.
Hnatek, A User's Handbook of D/A and A/D Converters, John Wiley & Sons, 1976, pp. 262–268.
Susskind, Notes on Analog-Digital Conversion Techniques, The Technology Press, MIT, 1957, pp. 5-2 to 5-11.

*Primary Examiner*—T. J. Sloyan
*Attorney, Agent, or Firm*—David M. Keay

[57] ABSTRACT

Microprocessor controlled analog-to-digital converting apparatus. For each analog signal input line there is a comparator having one input connected to the associated analog signal input line. A ramp generator is connected in common to the other input of all of the comparators. A multiplexing arrangement is operated by the microprocessor to couple a selected one of the comparators to a storage register in the microprocessor. The selected comparator compares the voltage of the analog input signal to the ramp voltage. If the analog voltage is higher, the comparator output remains inactive and the microprocessor causes a count to be stored in the storage register. The ramp generator is toggled to increase the ramp voltage by a predetermined step. The comparison of the analog voltage and ramp voltage is repeated. If the comparator output remains inactive, another count is accumulated in the storage register and the ramp generator is toggled to increase its voltage by another step. The procedure continues until the ramp voltage exceeds the analog signal voltage and the comparator output becomes active. The microprocessor then causes the multiplexing arrangement to uncouple the selected comparator from the storage register. The accumulated count in the storage register is a digital representation of the analog signal voltage.

2 Claims, 9 Drawing Figures

ANALOG-TO-DIGITAL CONVERTING APPARATUS

BACKGROUND OF THE INVENTION

This invention relates to analog-to-digital converters. More particularly, it is concerned with analog-to-digital converting apparatus controlled by a microprocessor.

In many control systems which operate with data in digital form, specifically microprocessor systems, a large amount of data is obtained in analog form and must be converted to digital form before processing. For analog-to-digital converting apparatus having a large number of analog inputs it has been conventional to multiplex the analog inputs into the converting apparatus. With this technique, however, analog voltages must be conducted through many noise sensitive lines decreasing the accuracy of the received data. In addition, there are problems in expanding the number of analog inputs into the system.

SUMMARY OF THE INVENTION

An improved analog-to-digital converting apparatus in accordancae with the present invention incorporating microprocessor control includes a plurality of analog signal input lines. A like plurality of comparator means are provided, each having first and second input terminals and an output terminal. Each of the comparator means produces a first output signal at its output terminal when the voltage at the first input terminal is greater than the voltage at the second input terminal, and produces a second output signal at the output terminal when the voltage at the second input terminal is greater than the voltage at the first input terminal. Each analog signal input line is connected to the first input terminal of a different one of the comparator means.

The apparatus also includes ramp generatror means which is connected to the second input terminals of the comparator means. The ramp generator means produces a ramp voltage which increases in predetermined steps in response to toggle signals applied thereto. The apparatus also includes storage means for storing an accumulated count and selecting means for selectively coupling the output terminal of a comparator means to the storage means.

Means are included which apply a toggle signal to the ramp generator means. Means operate in response to the first output signal from the selected comparator means to cause the storage means to store a count, and also to cause the means which applies the toggle signal to apply a toggle signal to the ramp generator means whereby the ramp generator means produces a ramp voltage increased by a predetermined step. Thus, a count is added to the storage means for each predetermined step the ramp voltage is increased until the ramp voltage exceeds the analog voltage on the associated analog signal input line. The accumulated count is a digital representation of that analog voltage.

For a better understanding of the present invention, together with other and further objects, advantages, and capabilities thereof, reference is made to the following discussion and appended claims in connection with the above-described drawing.

DETAILED DESCRIPTION OF THE INVENTION

Figure 1:
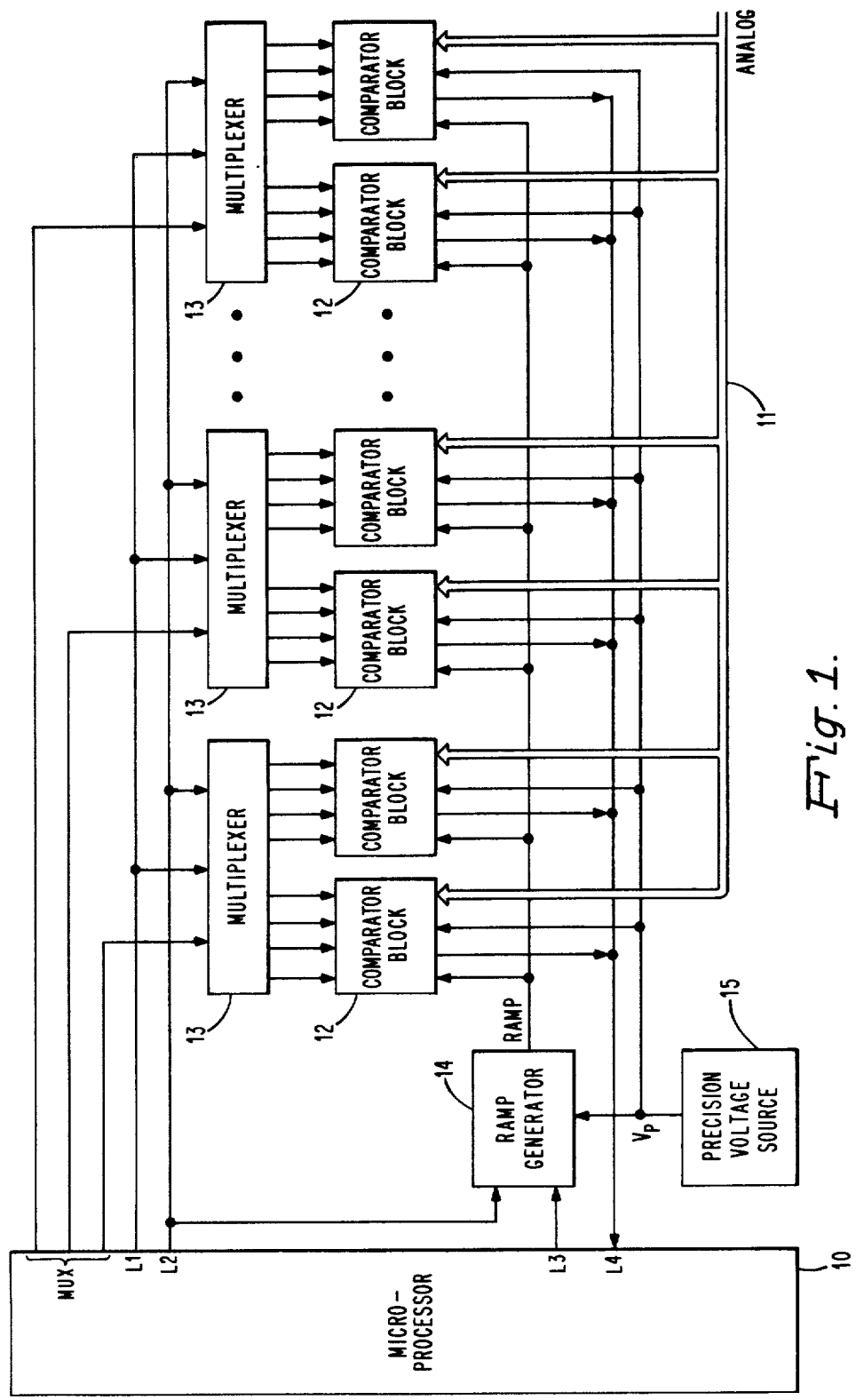
FIG. 1 is a schematic block diagram of a microprocessor controlled analog-to-digital converter apparatus in accordance with the present invention.

FIG. 1 is a block diagram of analog-to-digital converting apparatus in accordance with the present invention. The apparatus incorporates a microprocessor 10 for controlling the operation of the various elements external of the microprocessor as well as certain internal elements. Analog input signals are conducted over ANALOG input lines 11 to comparator blocks 12 where they are compared with the output voltage RAMP of a ramp generator 14. The particular ANALOG signal to be converted is selected by one of the multiplexers 13 under the control of signals on I/O lines L1, L2, and MUX from the microprocessor 10. A precision voltage source 15 provides a precise DC voltage $V_P$ for insuring precise output voltages RAMP from the ramp generator 14. The output voltage $V_P$ of the precision voltage source 15 may also be used to provide precise ANALOG input signals obtained by proportional resistance measurements as will be explained hereinbelow.

Figure 2:
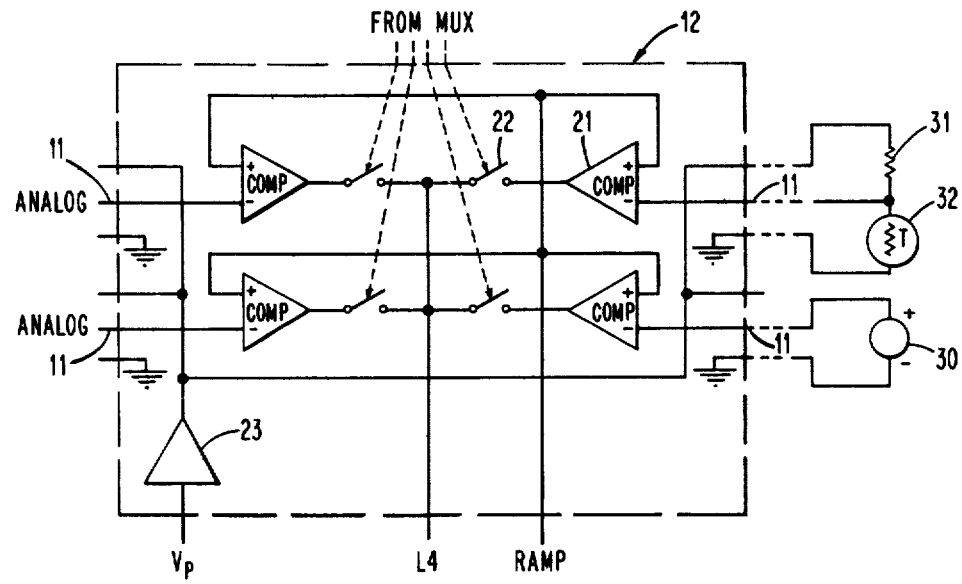
FIG. 2 is a schematic diagram illustrating a portion of the apparatus of FIG. 1 in greater detail.

FIG. 2 shows a comparator block 12 in greater detail. Each comparator block 12 accommodates four ANALOG input lines 11. Each block also contains four comparators 21, one associated with each analog input line 11. The noninverting inputs of all of the comparators 21 are connected in common to the output RAMP from the ramp generator 14. An ANALOG input line 11 is connected to the inverting input of an associated comparator 21. The output of each comparator 21 is connected through a switching arrangement 22, illustrated in the figure symbolically as a normally open switch, to a comparator output line L4 connected to the microprocessor 10. The switches 22 are, in effect, opened and closed by the multiplexers 13. In the specific embodiment shown, one multiplexer 13 operates the switches 22 in two comparator blocks 12. The output voltage $V_P$ from the precision voltage source 15 is made available to the comparator block 12 by way of a buffer 23.

As shown in FIG. 2 for illustrative purposes only, the ANALOG signal applied to a comparator 21 over an input line 11 may be a DC voltage from some potential source 30. Alternatively, the ANALOG signal may be the voltage across a resistance of a resistive divider. For example, the precision voltage $V_P$ is applied across a voltage divider of a fixed resistance 31 and a variable resistance 32, such as a temperature sensitive resistor 32.

The ANALOG input signal is the DC voltage across the variable resistance 32.

The apparatus operates under control of the microprocessor 10. The signals from the microprocessor on I/O lines L1, L2, and MUX select a particular multiplexer 13 and designate a particular comparator 21 and its associated ANALOG input signal line 11 controlled by the multiplexer. The multiplexer responds to signals from the microprocessor to close the selected switch 22 connecting the output of a comparator 21 directly to the comparator output line L4 to the microprocessor.

After the ANALOG input line is selected, the microprocessor by way of signals on line L3 causes the ramp generator 14 to produce the first of a sequence of RAMP voltage steps to the comparators 21. If the RAMP voltage is less than the ANALOG voltage, the resulting output signal from the selected comparator is conducted on line L4 to the microprocessor 10 and the microprocessor 10 stores a count in a storage register within the microprocessor. The ramp generator 14 is then toggled to the next voltage step and the comparison process with the ANALOG signal repeated by the comparator 21. The count accumulated in the storage register of the microprocessor 10 for each comparison in which the ANALOG input voltage is greater than the RAMP voltage step. When the RAMP voltage exceeds that of the ANALOG signal during a comparison procedure, the resulting output signal from the comparator 21 causes the microprocessor to produce signals on the L1, L2, and MUX lines which cause the multiplexer to open the switch 22 between the comparator 21 and the comparator output line L4. Thus, the analog-to-digital conversion process for the selected ANALOG signal is completed with an accumulated count representative of the ANALOG voltage stored in a storage register in the microprocessor 10. The microprocessor 10 and other associated apparatus (not shown) may then utilize the digital data.

Figure 3:
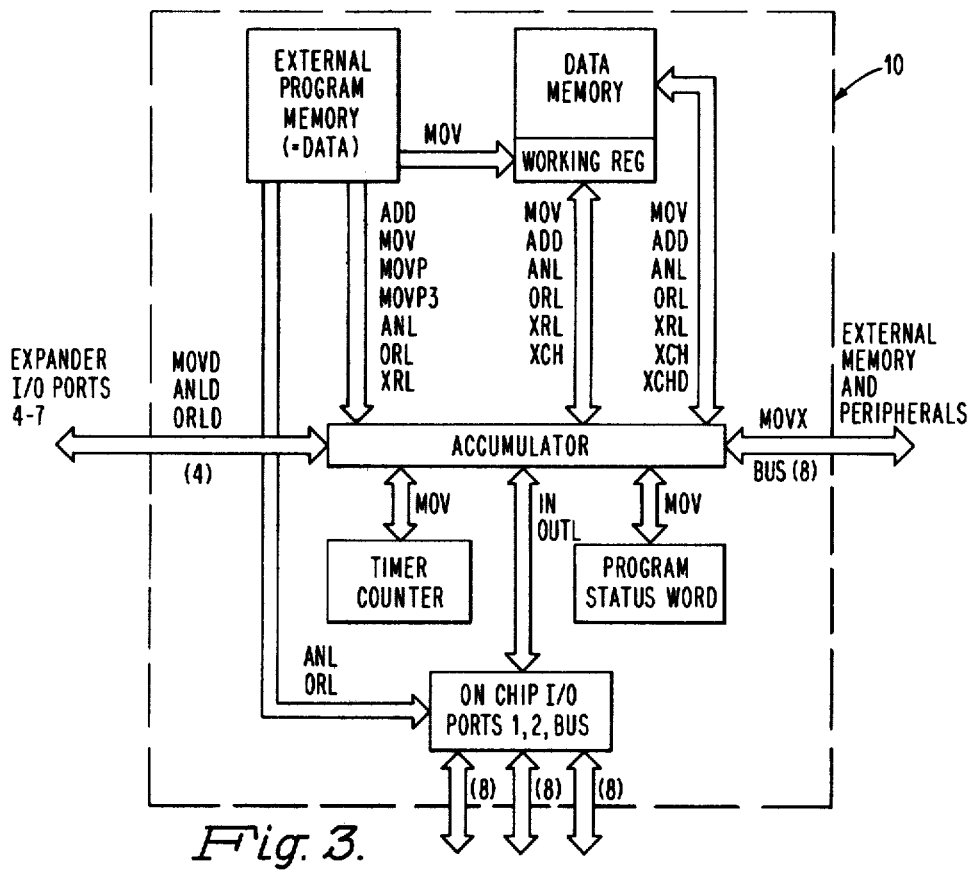
FIG. 3 is a schematic diagram of a conventional microprocessor employed in conjunction with the apparatus in accordance with the present invention.

FIG. 3 is a schematic representation of elements of the microprocessor 10. Specifically, the microprocessor is an 8039 microprocessor produced by Intel Corporation with a 2716 external program memory also produced by Intel Corporation. Details on the 8039 microprocessor and instructions on its operation are explained in detail in a publication of Intel Corporation entitled "Intel MCS-48 Family of Single Chip Microcomputers Users Manual," August, 1980.

The comparators 21, shown in FIG. 2, may each be an LM 239 produced by National Semiconductor Corporation. Transistor circuitry 22 which operates as a switch is connected to the output of each comparator, and in response to an appropriate voltage signal connects the output of the comparator to the comparator output line L4. The switching function is illustrated by the switch symbol 22 between each comparator and the comparator output line L4. The switches 22 are controlled by the associated multiplexers 13.

Figure 4:
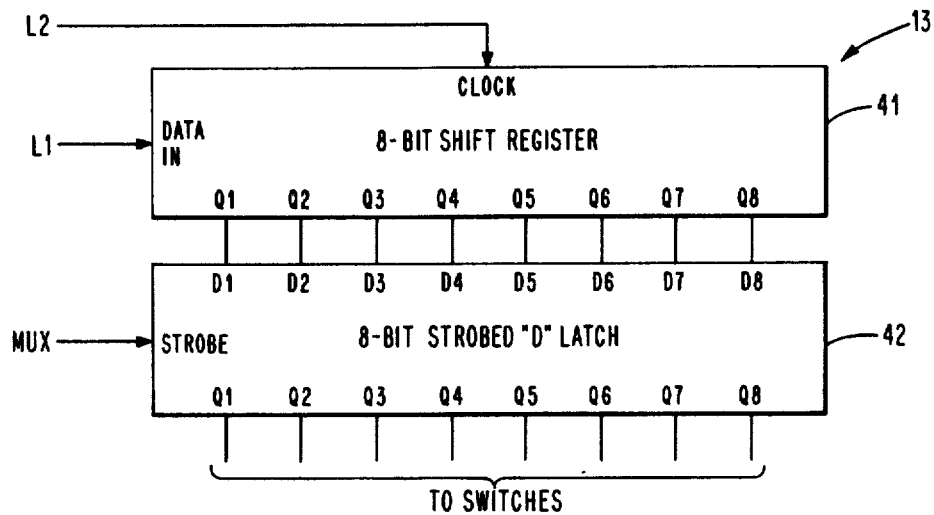
FIG. 4 is a schematic diagram of a multiplexer employed in the apparatus of FIG. 1.

FIG. 4 is a diagram of one of the multiplexers 13 for selecting one of eight comparators 21 and associated ANALOG input line 11. The multiplexer 13 includes an 8-bit shift register 41 which may incorporate an RCA CD4015B shift register and associated components. The outputs of the shift register 41 are applied to an 8-bit strobed "D" latch 42 which may incorporate two RCA CD4042B latches and associated components. Lines L1, L2, and one of the MUX lines from the microprocessor 10 are connected to the multiplexer 13 as shown.

Figure 5A:
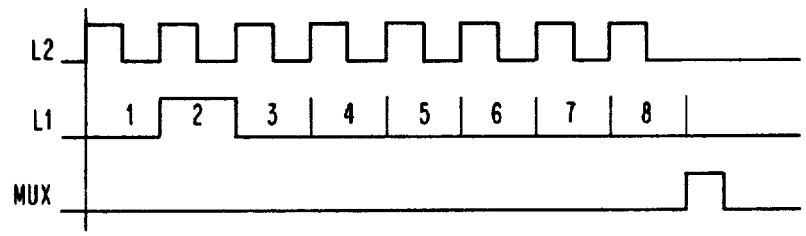
FIGS. 5A and 5B are diagrams of signals produced by the microprocessor for controlling the operation of the multiplexers.

In order to select a particular multiplexer and a particular ANALOG input line controlled by the multiplexer, the microprocessor produces an appropriate set of signals on those I/O lines. An exemplary set of signals is shown in FIG. 5A. On line L2 the microprocessor produces a series of eight clock pulses. During the series of clock pulses an appropriate pulse on line L1 designates one of the eight ANALOG input lines; the one designated "2" in the example of FIG. 5A. These signals are applied to all the multiplexers 13. A strobe pulse on the MUX line to the appropriate multiplexer latches the latch 42 causing it to produce a continuous signal on the output line designated by the signal received on line L2. The output signal from latch 42 is applied to the switch 22 associated with the designated comparator 21 thereby connecting the output of the selected comparator 21 to comparator output line L4.

Figure 5B:
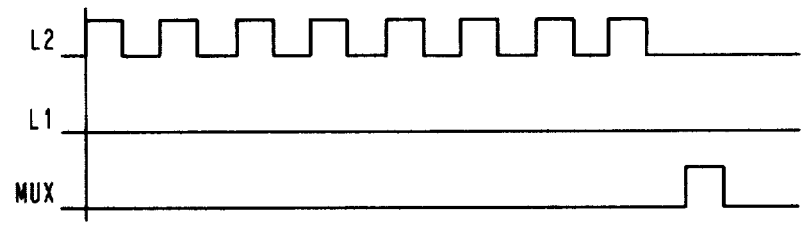

Upon completion of the analog-to-digital conversion process, as will be explained hereinbelow, the microprocessor 10 produces the set of signals as shown in FIG. 5B. On the strobe pulse on the MUX line the latch 22 is unlatched and the closed switch 22, in effect, is opened thereby disconnecting the associated comparator 21 and ANALOG input line from the comparator output line L4.

Figure 6:
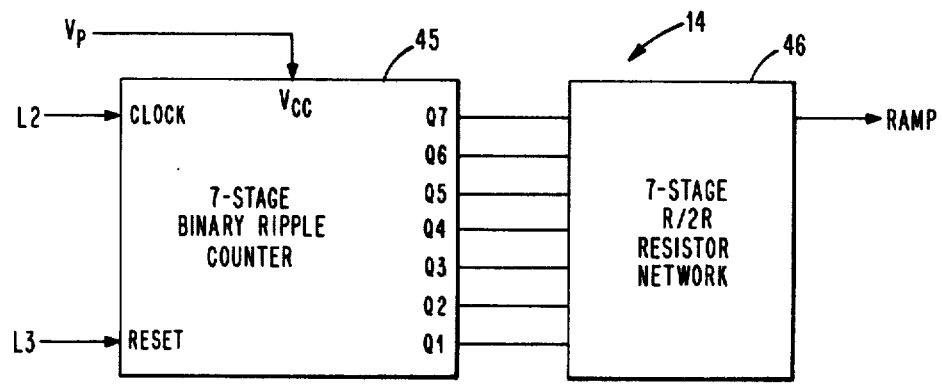
FIG. 6 is a schematic diagram of a ramp voltage generator employed in the apparatus of FIG. 1.

The ramp generator 14 is shown in FIG. 6. The ramp generator includes a 7-stage binary ripple counter 45 which may incorporate an RCA CD4024BE 7-stage counter. The outputs of the counter 45 are applied to a 7-stage resistor network 45, for example an Allen-Bradley 316LO82523 resistor network. A pulse on line L3 from the microprocessor or resets the ripple counter 45 to zero. Each pulse on line L2 toggles counter 45 causing the RAMP output voltage to be increased by a predetermined incremental step. The output voltage $V_P$ received from the precision voltage source 15 serves to insure precise predictable levels of output voltage at the RAMP output. The precision voltage source 15 may incorporate a Signetics $\mu$A723C voltage regulator.

As best explained by reference to the flow chart of FIG. 7, the apparatus of FIG. 1 operates in the following manner to convert an ANALOG input signal on one of the ANALOG input lines 11 to a digital representation stored in a register of the microprocessor 10. The selection of the particular ANALOG input line and the utilization of the digital representation are controlled by the stored program of the microprocessor and are not pertinent to the present invention. As shown in the flow chart of FIG. 7 at the start of a conversion procedure the register r, any one of the working registers in the microprocessor, is set to zero. The microprocessor then selects the desired ANALOG input line 11 by carrying out an appropriate subroutine as illustrated by the flow chart of FIG. 8. An example of the resulting signals applied to the multiplexers 13 on the L1, L2, and MUX I/O lines are shown in FIG. 5A. As explained previously, these signals cause a multiplexer to, in effect, close the switch 22 between the designated comparator 21 and the comparator output line L4.

After completion of the ANALOG input selection routine, line L3 is toggled resetting the ramp generator 14 to zero. Next, line L2 is toggled to create a first RAMP output voltage step from the ramp generator 14. This RAMP voltage is compared with the selected ANALOG signal voltage by the associated comparator 21. The output condition of the comparator 21 is either inactive indicating that the ANALOG signal voltage is higher than the applied RAMP voltage or is active indicating that the applied RAMP voltage is higher than the ANALOG signal voltage. If the inactive signal is present on line L4 indicating that the ANALOG voltage is greater than the RAMP voltage, the register r is incremented by one adding a count to the contents of the storage register. A check is then performed to determine whether or not the register r has reached a maximum accumulated count.

If the register r has not reached the maximum count, a pulse on line L2 again toggles the ramp generator 14 to increase the RAMP voltage by a predetermined incremental amount. If the ANALOG voltage still exceeds the RAMP voltage, the register r is incremented by one, the contents of the register are checked for the maximum amount, and the ramp generator is toggled once more. Operation continues in this manner with an additional count being added to the contents of the register r for each incremental step of the RAMP voltage.

Figures 7, 8:
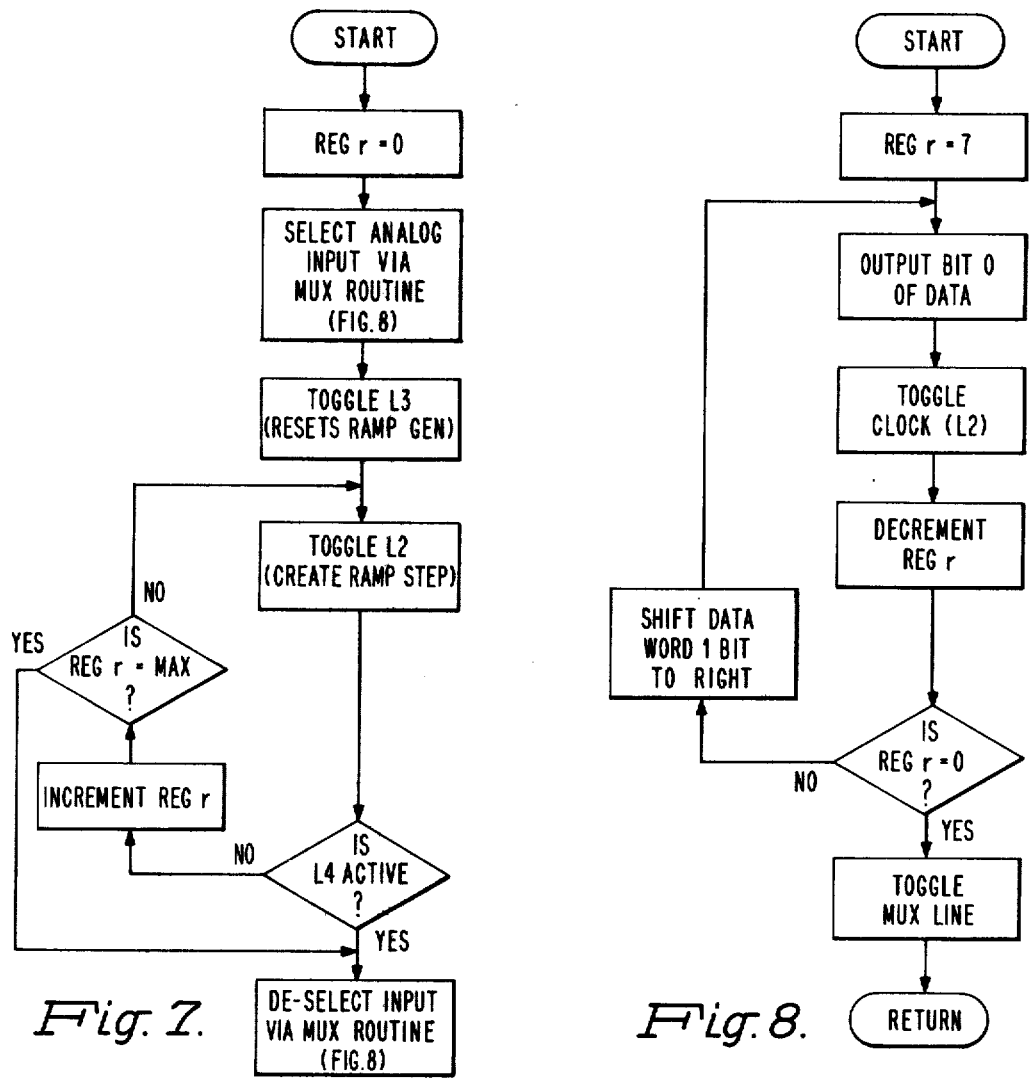
FIG. 7 is a flow chart of operations executed by the apparatus in providing an analog-to-digital conversion.
FIG. 8 is a flow chart of operations executed by the apparatus in performing a subroutine within the operations illustrated by the flow chart of FIG. 7.

When the signal on the comparator output line L4 goes active indicating that the RAMP voltage exceeds the ANALOG input voltage, or in the event the register r reaches the maximum accumulated count, the microprocessor repeats the multiplexer subroutine illustrated by the flow chart of FIG. 8. The microprocessor generates a set of de-select signals on the L1, L2, and MUX I/O lines as illustrated in FIG. 5B. The designated multiplexer 13 is unlatched opening the closed switch 22 as explained previously. The ANALOG input line and associated comparator 21 are thus disconnected from the comparator output line L4. The contents of the register r are a digital representation of the ANALOG input voltage.

For the specific embodiment of the invention under discussion employing an Intel 8039 microprocessor Table A shows the I/O connections for lines L1, L2, L3, L4, and one of the MUX lines.

Table B is the instruction set for an Intel 8039 microprocessor to operate in accordance with the procedure illustrated by the flow chart of FIG. 7. Table C is the instruction set for the multiplexer subroutine illustrated in FIG. 8. For the subroutine of Table C the data word designating one of the eight comparator switches is in the accumulator, and register r is register 3.

TABLE A

| | |
|---|---|
| L1 = | Bit 1, Port 1 |
| L2 = | Bit 2, Port 1 |
| L3 = | Bit 3, Port 1 |
| L4 = | Bit 4, Port 1 |
| MUX LINE = | Bit 5, Port 1 |
| MAX = | 07FH |

TABLE B

| | | |
|---|---|---|
| START: | MOV | Rr, #0 |
| | MOV | A, #Data; Put a "1" in desired bit location |
| | CALL | MUX (Table C) |
| | ANL | P1, #0F7H |
| | ORL | P1, #08H |
| | ANL | P1, #0F7H |
| LOOP: | ANL | P1, #0FBH |
| | ORL | P1, #04H |
| | ANL | P1, #0FBH |
| | IN | A, P1 |
| | JB4 | INC |
| DESEL: | MOV | A, #0 |
| | CALL | MUX (Table C) |
| | JMP | CONT |
| INC: | INC | Rr |
| | MOV | A, Rr |

TABLE B-continued

| | | |
|---|---|---|
| | ANL | A, #080H |
| | JZ | DESEL |
| | JMP | Loop |
| CONT: | Continue | |

TABLE C

The data word is in the accumulator.

| | | |
|---|---|---|
| MUX: | MOV | R3, #07H |
| LOOP: | JB0 | ONE |
| | ANL | P1, #0FCH |
| | JMP | Toggle |
| ONE: | ORL | P1, #02H |
| TOGGLE: | ORL | P1, #08H |
| | ANL | P1, #0F7H |
| | DJNZ | R3, Shift |
| | ANL | P1, #0CFH |
| | ORL | P1, #020H |
| | ANL | P1, #0CFH |
| | RET | |
| SHIFT: | RR | A |
| | JMP | LOOP |

Analog-to-digital converting apparatus in accordance with the present invention as illustrated hereinabove multiplexes the digital signal lines after comparison and not the analog input lines. The apparatus employs a single ramp generator which may be utilized with any number of analog input lines. A minimum number of I/O lines from the microprocessor are required. The number of analog input lines is readily expandable merely by increasing the number of comparator blocks, associated multiplexers, and multiplexer strobe lines from the microprocessor. A single precision voltage source may be employed for stabilizing the operation of the ramp voltage generator and also for providing precision in measuring proportional resistances.

While there has been shown and described what is considered a preferred embodiment of the present invention, it will be obvious to those skilled in the art that various changes and modifications may be made therein without departing from the invention as defined by the appended claims.

What is claimed is:

1. Analog-to-digital converting apparatus including
a plurality of analog signal input lines;
a like plurality of comparator means each having first and second input terminals and an output terminal, and being operable to produce a first output signal at the output terminal when the voltage at the first input terminal is greater than the voltage at the second input terminal and to produce a second output signal at the output terminal when the voltage at the second input terminal is greater than the voltage at the first input terminal;
each analog signal input line being connected to the first input terminal of a different one of said comparator means;
ramp generator means connected to the second input terminals of all the comparator means and being operable to produce a ramp voltage which increases in predetermined steps in response to toggle signals applied thereto;
a single comparator output line;
a like plurality of switching means, each being operable to connect the output terminal of a different one of said comparator means to said comparator output line;

multiplexing means coupled to said plurality of switching means, said multiplexing means being operable in response to select signals applied thereto to cause the switching means designated by the select signals to connect the output terminal of the associated comparator means to said comparator output line, and said multiplexing means being operable in response to de-select signals applied thereto to cause the switching means to disconnect the output terminal of the associated comparator means from said comparator output line;

processing means comprising a single storage means for storing an accumulated count coupled to the comparator output line;

means for applying select signals to said multiplexing means designating a selected one of said plurality of switching means whereby said multiplexing means causes the designated switching means to connect the output terminal of the associated comparator means to the comparator output line;

means for resetting said ramp generator means to a starting ramp voltage;

means for applying a toggle signal to said ramp generator means whereby the ramp voltage produced by the ramp generator means increases by a predetermined step;

means operable in response to said first output signal from the selected comparator means subsequent to a toggle signal to cause the storage means to add a count to the accumulated count and to cause said means for applying a toggle signal to said ramp generator means to apply a toggle signal to said ramp generator means; and means operable in response to said second output signal from the selected comparator means subsequent to a toggle signal to apply de-select signals to said multiplexing means whereby said multiplexing means causes the switching means to disconnect the output terminal of the associated comparator means from the comparator output line;

whereby the count accumulated in the storage means when the selected comparator means is disconnected from the comparator output line is a digital representation of the analog voltage present on the analog signal input line associated with the selected comparator means.

2. Analog-to-digital converting apparatus in accordance with claim 1 wherein said processing means includes means operable in response to a predetermined maximum accumulated count in said storage means to apply said de-select signals to said multiplexing means.

* * * * *